(12) United States Patent
Minaminaka et al.

(10) Patent No.: US 10,950,468 B2
(45) Date of Patent: Mar. 16, 2021

(54) SEMICONDUCTOR MANUFACTURING APPARATUS

(71) Applicant: TOSHIBA MEMORY CORPORATION, Minato-ku (JP)

(72) Inventors: Makoto Minaminaka, Suzuka (JP); Tsutomu Fujita, Yokkaichi (JP); Keisuke Tokubuchi, Yokkaichi (JP); Akira Tomono, Yokkaichi (JP); Takanobu Ono, Kuwana (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 226 days.

(21) Appl. No.: 15/911,319

(22) Filed: Mar. 5, 2018

(65) Prior Publication Data
US 2019/0080940 A1    Mar. 14, 2019

(30) Foreign Application Priority Data

Sep. 13, 2017 (JP) .............................. JP2017-176070

(51) Int. Cl.
*B23K 26/00* (2014.01)
*H01L 21/67* (2006.01)
(Continued)

(52) U.S. Cl.
CPC .... *H01L 21/67092* (2013.01); *B23K 26/0006* (2013.01); *B23K 26/064* (2015.10);
(Continued)

(58) Field of Classification Search
CPC ............ B23K 2101/40; B23K 2103/56; B23K 26/0006; B23K 26/0622; B23K 26/064;
(Continued)

(56) References Cited

U.S. PATENT DOCUMENTS 5,635,976 A * 6/1997 Thuren ................... G03F 7/704
347/253
5,636,976 A * 6/1997 Niwa .................. B29C 45/2708
418/55.4

(Continued)

FOREIGN PATENT DOCUMENTS

CN        105665946 A      6/2016
JP        2011-51011       3/2011
(Continued)

*Primary Examiner* — Sang Y Paik
(74) *Attorney, Agent, or Firm* — Oblon, McClelland, Maier & Neustadt, L.L.P.

(57) ABSTRACT

A semiconductor manufacturing apparatus according to an embodiment irradiates a semiconductor substrate with laser to form modified regions along an intended cut line in the semiconductor substrate. A light source emits the laser. An optical system comprises an objective lens configured to focus the laser in the semiconductor substrate. A light modulator is capable of modulating an energy density distribution of the laser. A controller controls the light modulator to displace a peak position of the energy density distribution of the laser from an optical axis of the objective lens in a relative movement direction of the optical system with respect to the semiconductor substrate.

11 Claims, 12 Drawing Sheets

(51) Int. Cl.
*B23K 26/06* (2014.01)
*B23K 26/38* (2014.01)
*B23K 26/08* (2014.01)
*B23K 26/53* (2014.01)
*B23K 26/0622* (2014.01)
*B23K 26/064* (2014.01)
*B23K 101/40* (2006.01)
*B23K 103/00* (2006.01)

(52) U.S. Cl.
CPC ...... *B23K 26/0622* (2015.10); *B23K 26/0648* (2013.01); *B23K 26/0823* (2013.01); *B23K 26/0853* (2013.01); *B23K 26/0869* (2013.01); *B23K 26/38* (2013.01); *B23K 26/53* (2015.10); *H01L 21/67115* (2013.01); *B23K 2101/40* (2018.08); *B23K 2103/56* (2018.08)

(58) Field of Classification Search
CPC ............ B23K 26/0648; B23K 26/0823; B23K 26/0853; B23K 26/0869; B23K 26/38; B23K 26/53; D05B 3/02; D05D 2203/00; H01L 21/67092; H01L 21/67115
USPC .......................................... 219/121.6–121.83
See application file for complete search history.

(56) References Cited

U.S. PATENT DOCUMENTS

| | | | | |
|---|---|---|---|---|
| 6,341,029 | B1* | 1/2002 | Fillion | G02B 26/105 359/204.1 |
| 2008/0093349 | A1* | 4/2008 | Bruland | G02B 26/101 219/121.69 |
| 2009/0308853 | A1* | 12/2009 | Jiang | B23K 26/046 219/121.75 |
| 2009/0314755 | A1* | 12/2009 | Chung | B23K 26/0608 219/121.77 |
| 2010/0197116 | A1* | 8/2010 | Shah | B23K 26/38 438/463 |
| 2011/0000897 | A1* | 1/2011 | Nakano | B23K 26/046 219/121.67 |
| 2017/0113301 | A1 | 4/2017 | Sakamoto et al. | |

FOREIGN PATENT DOCUMENTS

| | | |
|---|---|---|
| JP | 2011-121061 | 6/2011 |
| JP | 2015-226012 | 12/2015 |
| JP | 2016-207765 | 12/2016 |
| JP | 2017-69309 | 4/2017 |
| TW | 201318753 A1 | 5/2013 |
| TW | 201505744 A | 2/2015 |
| TW | 201601867 A | 1/2016 |
| TW | 201607657 A | 3/2016 |

* cited by examiner

SEMICONDUCTOR MANUFACTURING APPARATUS

CROSS REFERENCE TO RELATED APPLICATIONS

This application is based upon and claims the benefit of priority from the prior Japanese Patent Application No. 2017-176070, filed on Sep. 13, 2017, the entire contents of which are incorporated herein by reference.

FIELD

The embodiments of the present invention relate to a semiconductor manufacturing apparatus.

BACKGROUND

When chips are to be singulated from a semiconductor substrate, a method of focusing laser on the semiconductor substrate to generate a modified layer and cleaving the semiconductor substrate along the modified layer is used. The modified layer in the semiconductor substrate is cleaved to some extent by internal stress and thus the laser is sometimes reflected or refracted on the cleaved surface. Scattered light produced by reflection or refraction of the laser may reach a region of a semiconductor integrated circuit on the semiconductor substrate and damage the semiconductor integrated circuit.

In order to suppress the scattered light, reducing laser output (a method 1) or elongating the oscillation period of the laser to widen the pitch between adjacent modified regions (a method 2) is conceivable. Because the energy itself of the scattered light is small in the method 1, damages of the semiconductor integrated circuit can be suppressed. However, if the laser output is low, the modified regions become small and the number of times of laser irradiation (the number of passes) needs to be increased. Therefore, the processing requires a longer time, resulting in a lower productivity.

On the other hand, the laser irradiation pitch becomes wider in the method 2 and accordingly the laser is less likely to enter the cleaved surface already formed, which suppresses the scattered light. However, if the irradiation pitch is wide, the cleaved surface of the semiconductor substrate is not stable and it becomes difficult to singulate chips from the semiconductor substrate with high quality.

DETAILED DESCRIPTION

Figure 1:
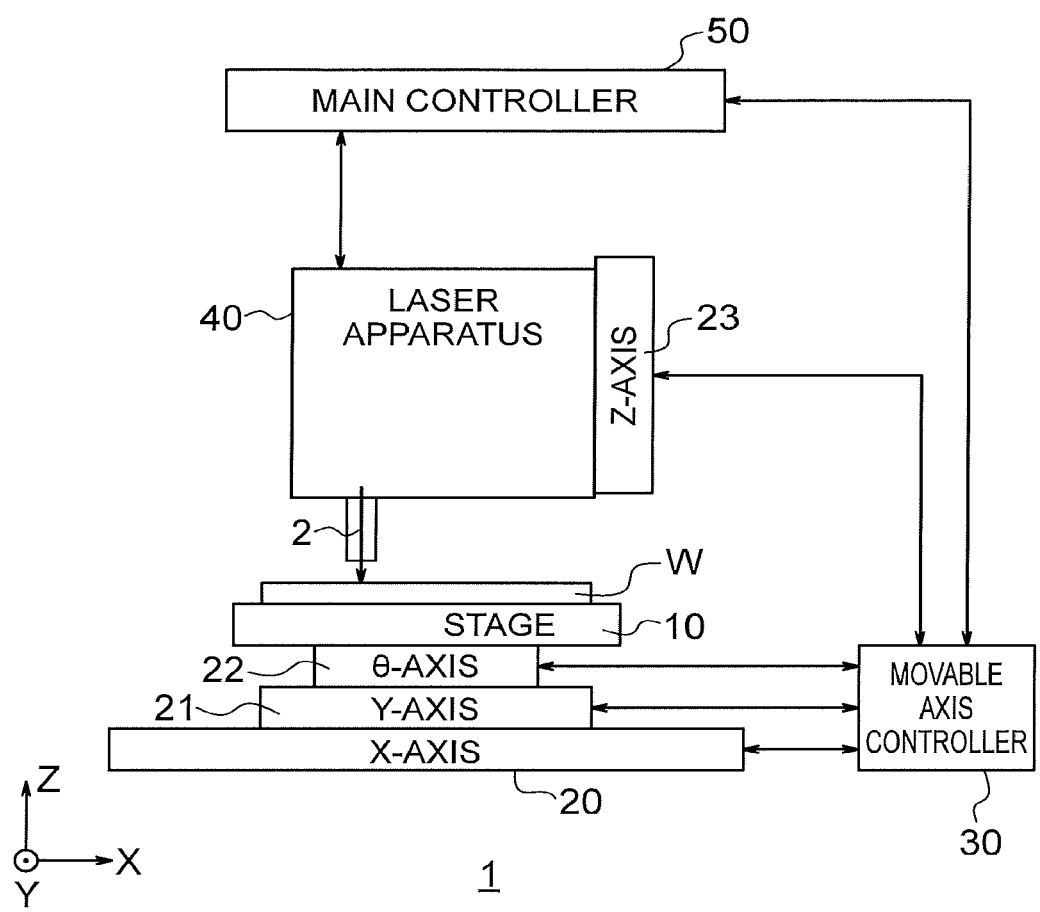
FIG. 1 is a schematic diagram illustrating a configuration example of a laser processing apparatus according to a first embodiment.

Embodiments will now be explained with reference to the accompanying drawings. The present invention is not limited to the embodiments. The drawings are schematic or conceptual, and the ratios and the like among respective parts may not be the same as those of actual products. In the present specification and the drawings, elements identical to those described with respect to the foregoing drawings are denoted by like reference characters and detailed explanations thereof are omitted as appropriate.

A semiconductor manufacturing apparatus according to an embodiment irradiates a semiconductor substrate with laser to form modified regions along an intended cut line in the semiconductor substrate. A light source emits the laser. An optical system comprises an objective lens configured to focus the laser in the semiconductor substrate. A light modulator is capable of modulating an energy density distribution of the laser. A controller controls the light modulator to displace a peak position of the energy density distribution of the laser from an optical axis of the objective lens in a relative movement direction of the optical system with respect to the semiconductor substrate.

First Embodiment

FIG. 1 is a schematic diagram illustrating a configuration example of a laser processing apparatus 1 according to a first embodiment. The laser processing apparatus 1 is an apparatus that irradiates a semiconductor substrate W with laser light along an intended cut line (a dicing line) to modify semiconductor crystals and form a modified layer. The semiconductor substrate W is cleaved along the modified layer, whereby the semiconductor substrate W is cut along the dicing line to singulate semiconductor chips. The laser processing apparatus 1 is thus used in laser dicing of the semiconductor substrate W.

This laser processing apparatus 1 includes a stage 10, movable axis drivers 20 to 23, a movable axis driver controller 30, a laser apparatus 40, and a main controller 50.

The stage 10 can have mounted thereon a semiconductor substrate W to be processed and adheres the semiconductor substrate W to be fixed thereon. The movable axis drivers 20 to 22 are provided below the stage 10 and enable a parallel movement or a rotational movement of the stage 10 within a substantially horizontal plane. The movable axis drivers 20 and 21 move the stage 10 parallelly in an X-axis direction and a Y-axis direction within the substantially horizontal plane, respectively. The movable axis driver 22 rotationally moves the stage 10 within the substantially horizontal plane. The movable axis driver 23 is provided in the laser apparatus 40 to move the laser apparatus 40 itself.

The movable axis controller 30 controls the movable axis drivers 20 to 23. Accordingly, the movable axis controller 30 can move the stage 10 and the semiconductor substrate W relatively with respect to the laser apparatus 40. The movable axis controller 30 can move the laser apparatus 40 with respect to the stage 10.

The laser apparatus 40 oscillates pulses of laser light 2, shapes and modulates the laser light 2, and collects the laser light 2 into the semiconductor substrate W using an objective lens (a collector lens). The frequency of the pulses of the laser light 2 is, for example, about 90 kHz. In order to control the focus position of the laser light 2 in the semiconductor substrate W, the laser apparatus 40 is capable of being moved by the movable axis driver 23 in a Z direction. An internal configuration of the laser apparatus 40 is explained later with reference to FIG. 2.

The main controller 50 controls the entire laser processing apparatus 1, such as the laser apparatus 40 and the movable axis controller 30.

Figure 2:
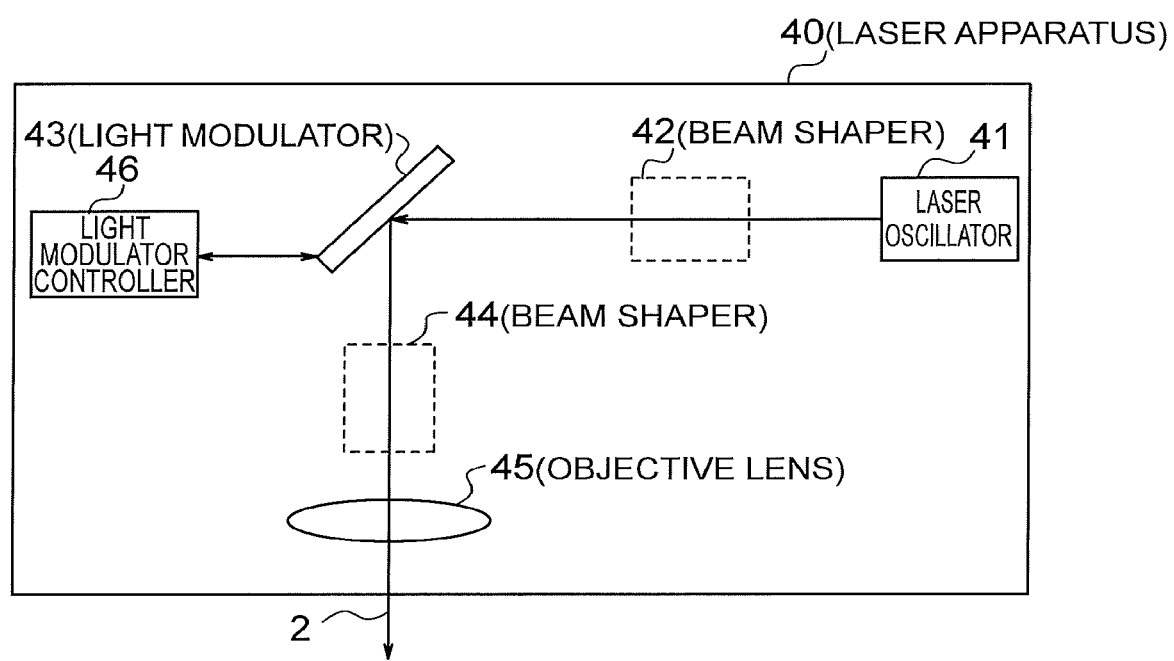
FIG. 2 is a schematic diagram illustrating an example of an internal configuration of a laser apparatus.

FIG. 2 is a schematic diagram illustrating an example of an internal configuration of the laser apparatus 40. The laser apparatus 40 includes a laser oscillator 41, a beam shaper 42, a light modulator 43, a beam shaper 44, an objective lens (a collector lens) 45, and a light modulator controller 46.

The laser oscillator 41 serving as a light source oscillates and emits pulses of laser light. The beam shaper 42 adjusts an energy density distribution (that is, an energy intensity distribution) of the laser light from the laser oscillator 41.

The light modulator 43 includes pixel electrodes (not illustrated) arrayed two-dimensionally in a grid manner or a matrix manner and controls the wavelength, the phase, the energy density distribution (that is, the energy intensity distribution), and the like of the laser light with voltages to be applied to the pixel electrodes.

The light modulator controller 46 controls the light modulator 43 to change the wavelength, the phase, the energy density (that is, the energy intensity), and the like of the laser light. An internal configuration of the light modulator controller 46 is explained later with reference to FIG. 3.

The laser light modulated by the light modulator 43 is finally adjusted by the beam shaper 44 and is collected by the objective lens 45. The objective lens 45 irradiates the semiconductor substrate W with the laser light to collect the laser light to a predetermined depth position in the semiconductor substrate W.

The beam shapers 42 and 44 and the objective lens 45 function as an optical system that modulates the laser light and collects the modulated laser light to the semiconductor substrate W.

Figure 3:
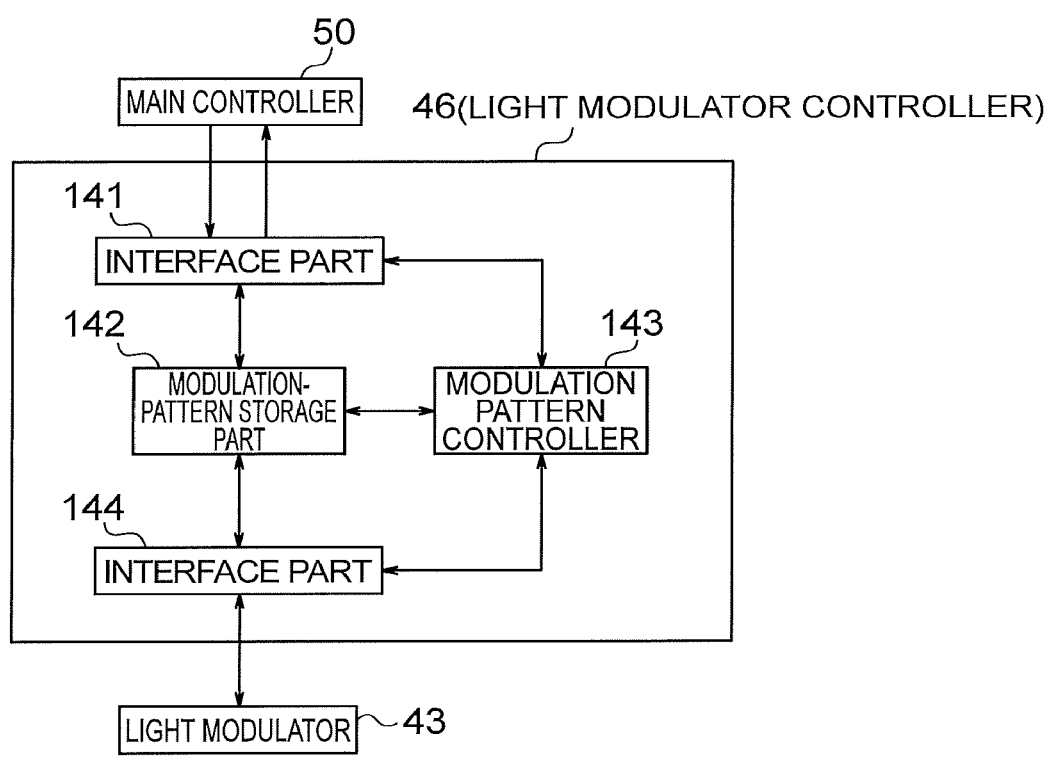
FIG. 3 is a block diagram illustrating an example of an internal configuration of a light modulator controller.

FIG. 3 is a block diagram illustrating an example of an internal configuration of the light modulator controller 46. The light modulator controller 46 includes interface parts 141 and 144, a modulation-pattern storage part 142, and a modulation pattern controller 143.

The modulation-pattern storage part 142 has stored therein a modulation pattern of the laser light such as the wavelength, the phase, and the energy density. The modulation pattern is a pattern of an electric signal to be output to the light modulator 43 at a predetermined timing to set the wavelength, the phase, the energy density, and the like of the laser light to a predetermined value or a predetermined range. The modulation pattern is previously input or selected by a user through the main controller 50 and is registered in the modulation-pattern storage part 142 via the interface part 141. The modulation-pattern storage part 142 outputs the modulation pattern to the modulation pattern controller 143 at a time of processing of the semiconductor substrate W.

The modulation pattern controller 143 controls the modulation-pattern storage part 142 and the interface parts 141 and 144. The modulation pattern controller 143 controls the light modulator 43 in accordance with the modulation pattern stored in the modulation-pattern storage part 142 via the interface part 144. Accordingly, the light modulator controller 46 can modulate the laser light irradiated to the semiconductor substrate W according to an operation of the stage 10 or the laser apparatus 40.

In the present embodiment, the light modulator controller modulates the energy density distribution (the energy intensity distribution) of the laser light. Therefore, in this example, the modulation pattern is a pattern of an electric signal for modulating the energy density distribution (the energy intensity distribution) of the laser light. The modulation pattern of the present embodiment is explained later. Although not particularly described here, the wavelength, the phase, and the like of the laser light can be constant or can be modulated during processing of the semiconductor substrate W.

Figure 4:
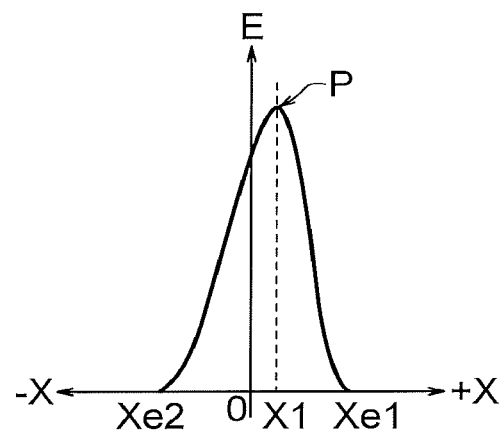
FIG. 4 is a graph illustrating an energy density distribution of laser light according to the first embodiment.

FIG. 4 is a graph illustrating the energy density distribution of the laser light according to the first embodiment. The horizontal axis represents a relative movement direction (a +X direction) of the objective lens 45 (the optical system) with respect to the semiconductor substrate W illustrated in FIG. 5. The vertical axis represents the energy density distribution (the energy intensity distribution) of the laser light. An origin 0 is a center position between a first end Xe1 and a second end Xe2 of the energy density distribution and an optical axis (a center of the pupil) of the objective lens 45. That is, the laser light enters the objective lens 45 in such a manner that the center position of the energy density distribution (the center position between Xe1 and Xe2) almost coincides with the optical axis of the objective lens 45.

Figure 9:
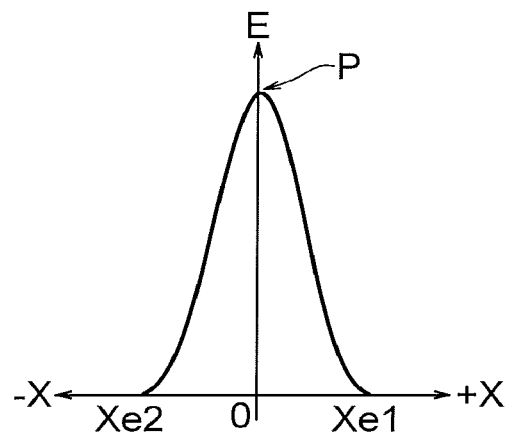
FIG. 9 is a graph illustrating an energy density distribution of laser light according to a second embodiment.

The energy density of the laser light generally has a Gaussian distribution that is symmetric about the vertical axis passing through the origin O (see FIG. 9). In this case, a peak position P of the energy density of the laser light is on the vertical axis. However, in the present embodiment, the peak position P of the energy density of the laser light is displaced in a processing progression direction from the vertical axis.

As illustrated in FIG. 4, the center position of the energy density distribution of the laser light (the center position between Xe1 and Xe2) substantially coincides with the origin O. However, the peak position P of the energy density distribution of the laser light is displaced in the +X direction (the movement direction of the objective lens 45) and is located at a position of +X1. That is, the peak position P of the energy density distribution of the laser light is offset by +X1 in the +X direction from a center point 0 of the energy density distribution. The light modulator controller 46 serving as a controller controls the light modulator 43 to displace the peak position P of the energy density distribution of the laser light in a relative movement direction (the +X direction) of the objective lens 45 with respect to the semiconductor substrate W from the center 0 of the energy density distribution. The peak position P indicates the position of a maximum value of the energy density (intensity) of the laser light 2.

Figure 5:
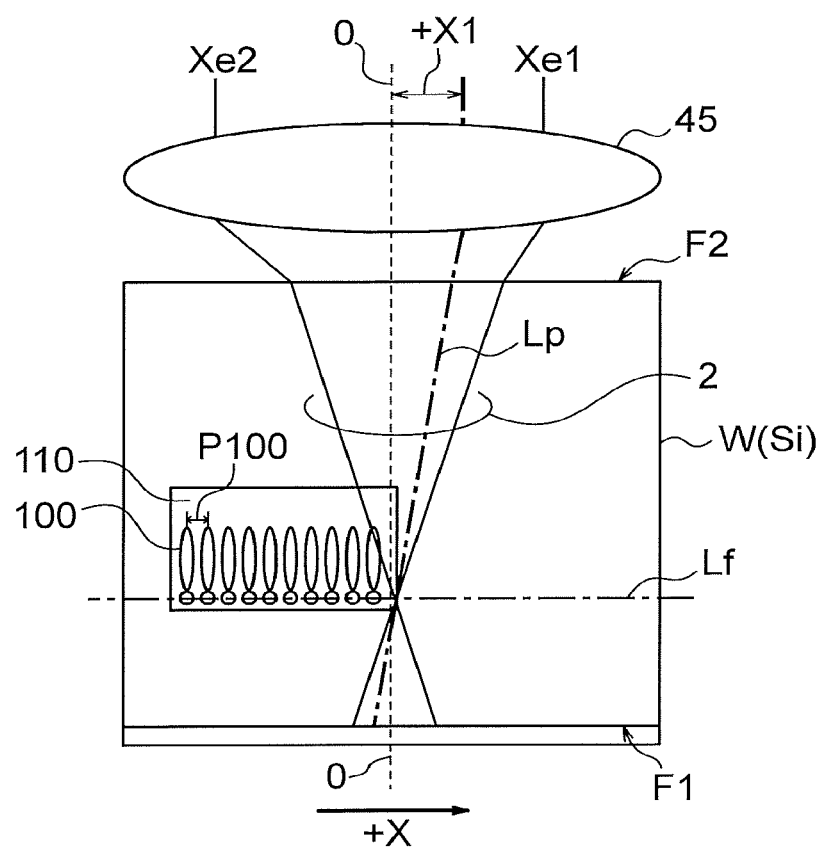
FIG. 5 is a sectional view illustrating a state of a semiconductor substrate being processed with laser light.

FIG. 5 is a sectional view illustrating a state of the semiconductor substrate W being processed with laser light. After having entered the objective lens 45, the laser light 2 enters the semiconductor substrate W from a rear surface F2 and is focused on a position Lf in the semiconductor substrate W. Energy of the laser light 2 breaks crystals (silicon crystals, for example) of the semiconductor substrate W at the position Lf and forms a modified region 100. A cleaved region 110 is formed by stress around the modified region 100. The modified region 100 extends to an upper part (on the side of the rear surface F2) than the focus position of the laser light 2 and does not extend so much to a lower part (on the side of a front surface F1) than the focus position. The modified region 100 is formed, for example, at a position about 40 micrometers from the front surface F1 of the semiconductor substrate W.

In practice, the laser apparatus 40 periodically oscillates pulses of the laser light 2 while the stage 10 is moving the semiconductor substrate W in a −X direction. Therefore, as illustrated in FIG. 5, the modified regions 100 are formed intermittently (discretely) in the relative movement direction (the +X direction) of the objective lens 45 with respect to the semiconductor substrate W. Because the irradiation pitch of the laser is relatively narrow, the modified regions 100 are formed in a layer manner or a band manner along a dicing line. Therefore, the modified regions 100 are hereinafter referred to also as "modified layer". In the present specification, it is described that the objective lens 45 moves relatively with respect to the semiconductor substrate W and the stage 10 during processing of the semiconductor substrate W. However, the stage 10 and the semiconductor substrate W can move with respect to the objective lens 45 (the optical system).

A line Lp in this example indicates a line of the peak position P of the energy density distribution of the laser light 2. While the laser light 2 enters centered on an optical axis 0 of the objective lens 45, the line Lp is offset by +X1 in the relative movement direction (the +X direction) of the objective lens 45 from the optical axis 0 of the objective lens 45. In other words, the light modulator controller 46 shifts the peak position P by +X1 in a formation direction (the +X direction) of the modified regions 100 with respect to the semiconductor substrate W from the center 0 of the energy density distribution. That is, the peak position P is displaced in the processing progression direction.

Accordingly, the laser light 2 at the peak position P where the energy density is high reaches the focus position Lf almost without passing through the modified regions 100 and the cleaved region 110. Due to the fact that the laser light 2 at the peak position P hardly passes through the modified regions 100 and the cleaved region 110, the laser light 2 with a high intensity is not scattered so much in the modified regions 100 and the cleaved region 110. That is, scattered light due to reflection or refraction of the laser light 2 is suppressed and damages of a semiconductor integrated circuit provided on the surface of the semiconductor substrate can be suppressed.

Figure 6:
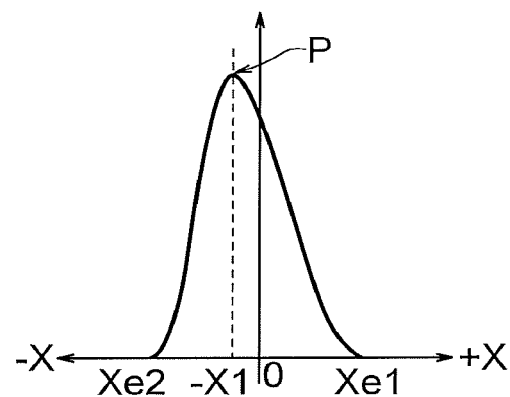
FIG. 6 is a graph illustrating an energy density distribution of laser light.
Figure 7:
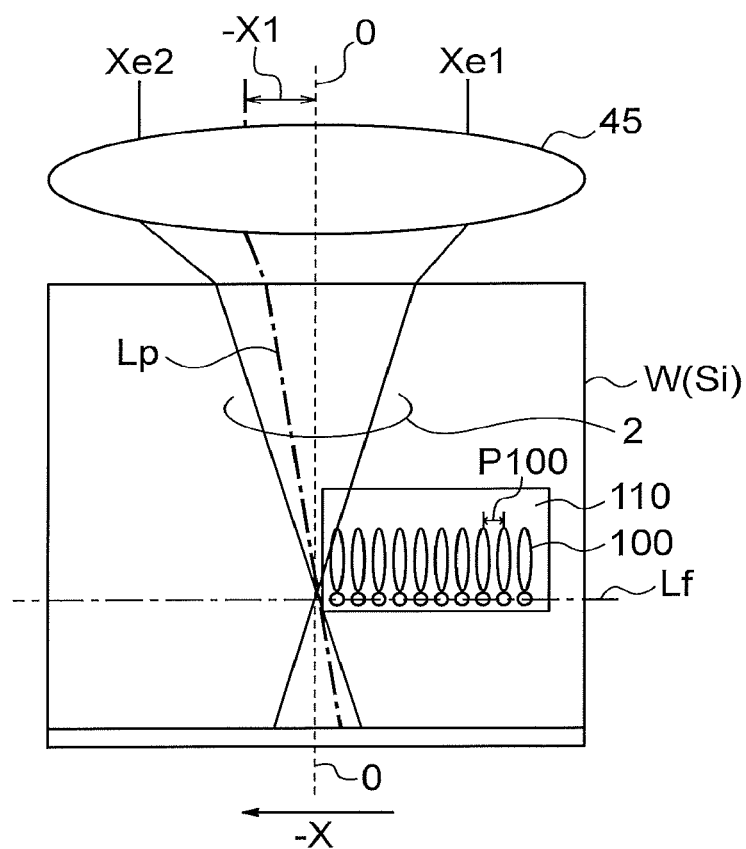
FIG. 7 is a sectional view illustrating a state of the semiconductor substrate being processed with laser light.

FIGS. 6 and 7 illustrate a case where the objective lens 45 travels in the opposite direction (the −X direction) with respect to the semiconductor substrate W.

FIG. 6 is a graph illustrating an energy density distribution of laser light. While the center position of the energy density distribution of the laser light (the center position between Xe1 and Xe2) substantially coincides with the origin 0, the peak position P of the energy density distribution of the laser light is displaced in the −X direction (the movement direction of the objective lens 45) and is located at a position of −X1. That is, the peak position P of the energy density distribution of the laser light is offset by −X1 in the −X direction from the center point 0 of the energy density distribution.

In this way, in the present embodiment, the light modulator controller 46 serving as the controller controls the light modulator to displace the peak position P of the energy density distribution of the laser light in the relative movement direction (the −X direction) of the objective lens 45 with respect to the semiconductor substrate W from the center 0 of the energy density distribution.

FIG. 7 is a sectional view illustrating a state of the semiconductor substrate W being processed with laser light. After having entered the objective lens 45, the laser light 2 enters the semiconductor substrate W from the rear surface F2 and is focused on the position Lf in the semiconductor substrate W. The energy of the laser light 2 breaks the crystals (silicon crystals, for example) of the semiconductor substrate W at the position Lf and forms a modified region 100. A cleaved region 110 is formed by stress around the modified region 100.

In practice, the laser apparatus 40 periodically oscillates pulses of the laser light 2 while the stage 10 is moving the semiconductor substrate W in the +X direction. Therefore, as illustrated in FIG. 7, the modified regions 100 are formed intermittently (discretely) in the relative movement direction (the −X direction) of the objective lens 45 with respect to the semiconductor substrate W.

While the laser light 2 enters centered on the optical axis 0 of the objective lens 45, Lp is offset by −X1 in the relative movement direction (the −X direction) of the objective lens 45 from the optical axis 0 of the objective lens 45. In other words, the light modulator controller 46 shifts the peak position P by −X1 in the formation direction (the −X direction) of the modified regions 100 with respect to the semiconductor substrate W from the center 0 of the energy density distribution. That is, the peak position P is displaced in the processing progression direction.

Accordingly, the laser light 2 at the peak position P where the energy density is high hardly passes through the modified regions 100 and the cleaved region 110 to reach the focus position Lf. Due to little passage of the laser light 2 at the peak position P where the intensity is high through the modified regions 100 and the cleaved region 110, the laser light 2 is not scattered so much in the modified regions 100 and the cleaved region 110. That is, scattered light due to reflection or refraction of the laser light 2 is suppressed and damages of the semiconductor integrated circuit provided on the surface of the semiconductor substrate can be suppressed.

In this way, according to the present embodiment, the light modulator controller 46 controls the light modulator 43 to displace the peak position P of the energy density distribution in the relative movement direction of the objective lens 45. Accordingly, semiconductor chips can be singulated with high quality from the semiconductor substrate W while the scattered light of the laser light 2 is suppressed.

As illustrated in FIGS. 5 and 7, when the movement direction of the objective lens 45 with respect to the semiconductor substrate W is changed, the light modulator controller 46 switches the displacement of the peak position P from the center of the energy density distribution according to the movement direction of the objective lens 45. That is, the light modulator controller 46 automatically switches the offset direction of the peak position P according to the movement direction of the objective lens 45 with respect to the semiconductor substrate W. For example, when the stage 10 is reciprocated while pulses of the laser light 2 are oscillated, the light modulator controller 46 automatically switches the displacement direction of the peak position P on an outward path (in the +X direction, for example) and a return path (in the −X direction, for example) from the +X direction to the −X direction. This enables the scattered light of the laser light 2 to be suppressed continuously even when the movement direction of the objective lens 45 with respect to the semiconductor substrate W is changed. As a result, the semiconductor substrate W can be processed efficiently, and the processing time can be relatively shortened while scattered light is suppressed.

(Consideration on Offset Amount)

Figure 8:
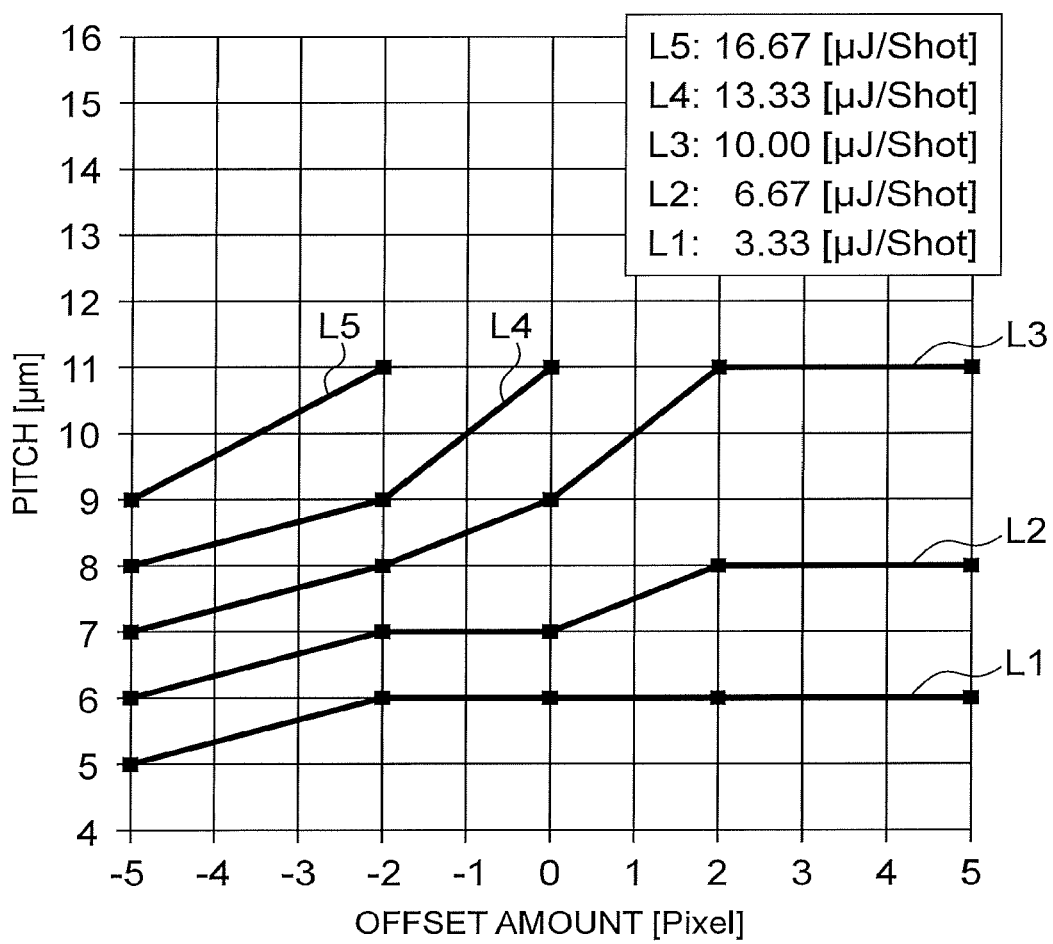
FIG. 8 is a graph illustrating a relation between an irradiation pitch of laser light and an offset amount of a peak position.

FIG. 8 is a graph illustrating a relation between the irradiation pitch of the laser light 2 and the offset amount of the peak position. The horizontal axis represents the offset amount of the peak position P with respect to the center position 0 of the energy density distribution of the laser light 2. The unit of the offset amount is the number of pixels of the light modulator 43. The relative movement direction of the objective lens 45 is assumed to be the −X direction. That is, the offset amount indicates −X1 in FIG. 7. The vertical axis represents the pitch (P100 in FIG. 7) between adjacent ones of the modified regions 100.

The offset amount can be previously stored as a part of information of the modulation pattern in the modulation-pattern storage part 142 in FIG. 4. The modulation pattern controller 143 displaces the peak position P from the center position 0 of the energy density distribution of the laser light 2 in accordance with the offset amount stored in the modulation-pattern storage part 142. The offset amount can be input directly to the modulation pattern controller 143 from the main controller 50 without being stored in the modulation-pattern storage part 142.

L1 to L5 indicate lower limit pitches that can keep the scattered light of the laser light 2 lower than a threshold value. Generally, as the pitch P100 is wider, the laser light 2 is more distant from adjacent modified regions 100 and thus is less likely to pass through the modified regions 100 and the cleaved region 110. Accordingly, as the pitch P100 is wider, the scattered light decreases. On the other hand, when the pitch P100 is narrower, the laser light 2 becomes closer to the adjacent modified regions 100 and the cleaved region 110 and thus becomes more likely to pass through the modified regions 100 and the cleaved region 110. Accordingly, as the pitch P100 is narrower, the scattered light increases.

Therefore, the lower limit pitches indicated by L1 to L5 being low means that the pitch P100 can be narrowed while the scattered light is suppressed. If the pitch P100 is too wide, cleavage of the semiconductor substrate W is not stabilized and singulation of chips from the semiconductor substrate W with high quality becomes difficult. Accordingly, considering the quality and reliability of the semiconductor chips, it is preferable that the pitch P100 be narrow. When the pitch P100 can be narrowed while the scattered light is suppressed, suppression of the scattered light and easy singulation can be both achieved.

Furthermore, L1 to L5 are different in the energy of one pulse (one shot) of the laser light 2. The energy of the laser light 2 indicated by L1 is, for example, 3.33 μJ/shot. The energy of the laser light 2 indicated by L2 is, for example, 6.67 μJ/shot. The energy of the laser light 2 indicated by L3 is, for example, 10.00 μJ/shot. The energy of the laser light 2 indicated by L4 is, for example, 13.33 μJ/shot. The energy of the laser light 2 indicated by L5 is, for example, 16.67 μJ/shot.

Referring to L1 to L5, the lower limit pitch needs to be increased to suppress the scattered light when the energy of the laser light 2 is increased. Meanwhile, when the offset amount becomes equal to or larger than 2 pixels in the −X direction (equal to or smaller than −2 pixels), the lower limit pitch becomes small regardless of the energy of the laser light 2. This means that the scattered light is suppressed by setting the displacement of the peak position P from the center position 0 of the energy density distribution of the laser light 2 to be equal to or larger than 2 pixels. Therefore, it can be said that the displacement of the peak position P from the center position 0 of the energy density distribution of the laser light 2 is preferably equal to or larger than 2 pixels.

Second Embodiment

FIG. 9 is a graph illustrating an energy density distribution of the laser light according to a second embodiment. In the first embodiment, the peak position P of the energy density distribution of the laser light is offset from the center point 0 of the energy density distribution. In contrast thereto, in the second embodiment, the entire laser light is displaced from the optical axis of the objective lens 45 without the peak position P being offset from the center point 0 of the energy density distribution. Therefore, in the second embodiment, the energy density of the laser light has a Gaussian distribution as illustrated in FIG. 9. In this case, the peak position P of the energy density of the laser light is on the vertical axis. On the other hand, the light modulator controller 46 displaces the entire laser light 2 from the optical axis 0 of the objective lens 45 as illustrated in FIGS. 10 and 11.

Figure 10:
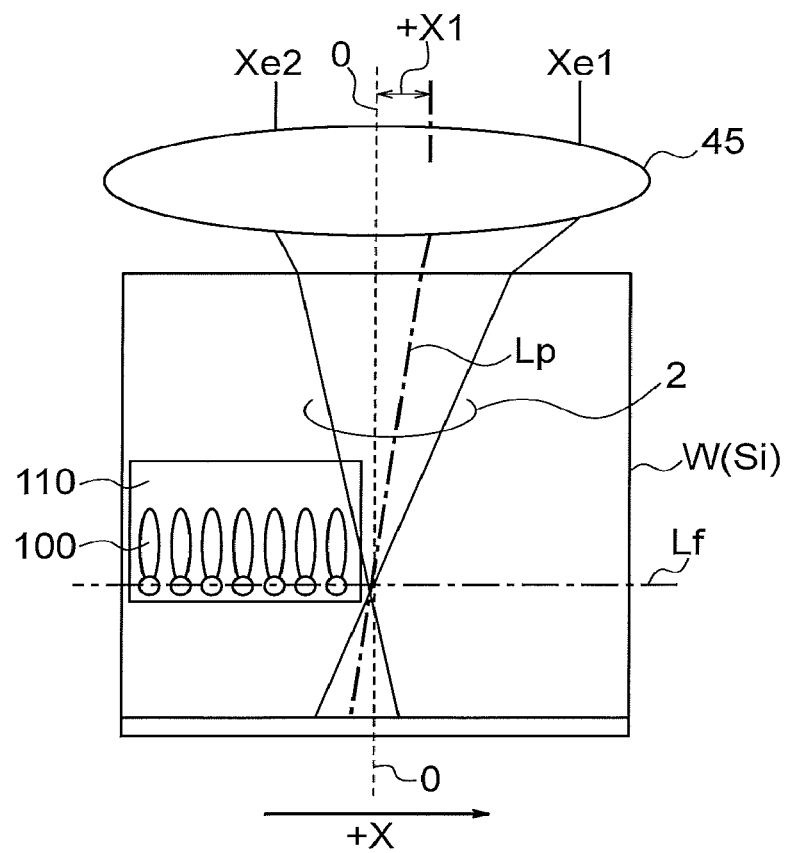
FIG. 10 is a sectional view illustrating a state of the semiconductor substrate being processed with a laser processing apparatus according to the second embodiment.
Figure 11:
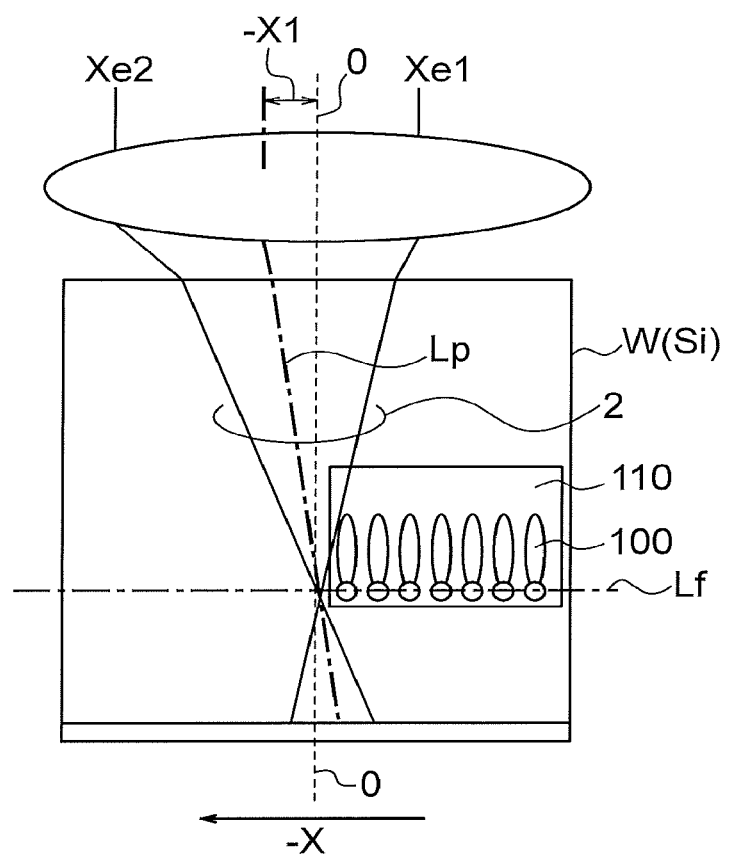
FIG. 11 is a sectional view illustrating a state of the semiconductor substrate being processed with the laser processing apparatus according to the second embodiment.

FIGS. 10 and 11 are sectional views illustrating a state of the semiconductor substrate W being processed with the laser processing apparatus 1 according to the second embodiment. While FIGS. 10 and 11 are different in the energy density distribution of the laser light 2 from that in FIGS. 5 and 7, other configurations are identical to those of the FIGS. 5 and 7.

As described above, the laser light 2 is offset in the relative movement direction (the +X direction) of the objective lens 45 with respect to the semiconductor substrate W from the optical axis 0 of the objective lens 45. In other words, the light modulator controller 46 displaces the entire laser light 2 with respect to the objective lens 45 to shift the peak position P by +X1 in the formation direction (the +X direction) of the modified regions 100 with respect to the semiconductor substrate W from the optical axis 0 of the objective lens 45. As a result, the peak position P is displaced in the processing progression direction similarly to the peak position P in the first embodiment.

FIG. 11 illustrates a case where the objective lens 45 travels in the opposite direction (the −X direction) with respect to the semiconductor substrate W. In this case, the laser light 2 is offset in the relative movement direction (the −X direction) of the objective lens 45 with respect to the semiconductor substrate W from the optical axis 0 of the objective lens 45. In other words, the light modulator controller 46 displaces the entire laser light 2 with respect to the objective lens 45 to shift the peak position P by −X1 in the formation direction (the −X direction) of the modified regions 100 with respect to the semiconductor substrate W from the optical axis 0 of the objective lens 45. As a result, the peak position P is displaced in the processing progression direction similarly to the peak position P in the first embodiment.

When the movement direction of the objective lens 45 with respect to the semiconductor substrate W is switched, the light modulator controller 46 automatically switches the offset direction of the laser light 2 with respect to the objective lens 45 according to the movement direction of the objective lens 45 with respect to the semiconductor substrate W.

Accordingly, the second embodiment can achieve effects identical to those of the first embodiment.

Third Embodiment

Figure 12:
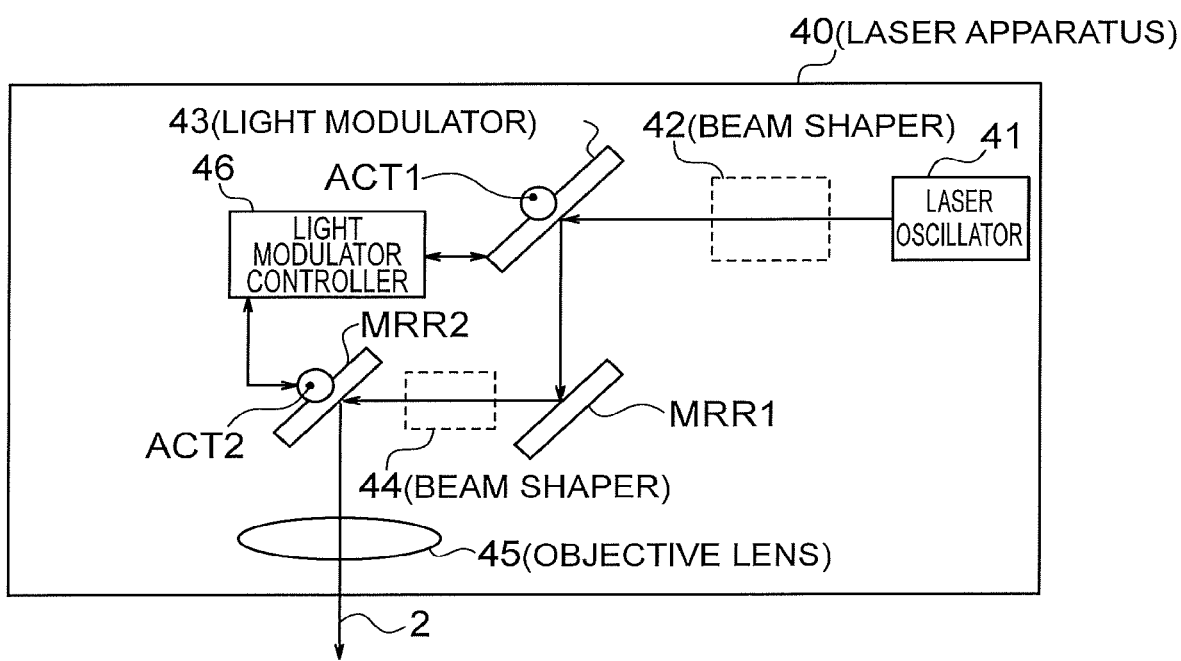
FIG. 12 is a schematic diagram illustrating an example of an internal configuration of a laser apparatus according to a third embodiment.

FIG. 12 is a schematic diagram illustrating an example of an internal configuration of the laser apparatus 40 according to a third embodiment. In the third embodiment, the light modulator controller 46 inclines the incident angle of the laser light 2 to the objective lens 45 from the optical axis of the objective lens 45.

In order to realize this mode, the laser apparatus 40 according to the third embodiment further includes mirrors MRR1 and MRR2, and actuators ACT1 and ACT2. The mirror MRR1 is placed on an optical path of the laser light between the light modulator 43 and the beam shaper 44. The mirror MRR2 is placed on an optical path of the laser light between the beam shaper 44 and the objective lens 45. The actuator ACT1 is provided in the light modulator 43 and can change the angle of the light modulator 43. The actuator ACT2 is provided in the mirror MRR2 and can change the angle of the mirror MRR2. The actuators ACT1 and ACT2 are controlled by the light modulator controller 46. The light modulator controller 46 changes the angles of the light modulator 43 and the mirror MRR2 in accordance with the modulation pattern. This can change the incident angle of the laser light 2. Other configurations of the third embodiment can be identical to corresponding configurations of the first embodiment.

Figure 13:
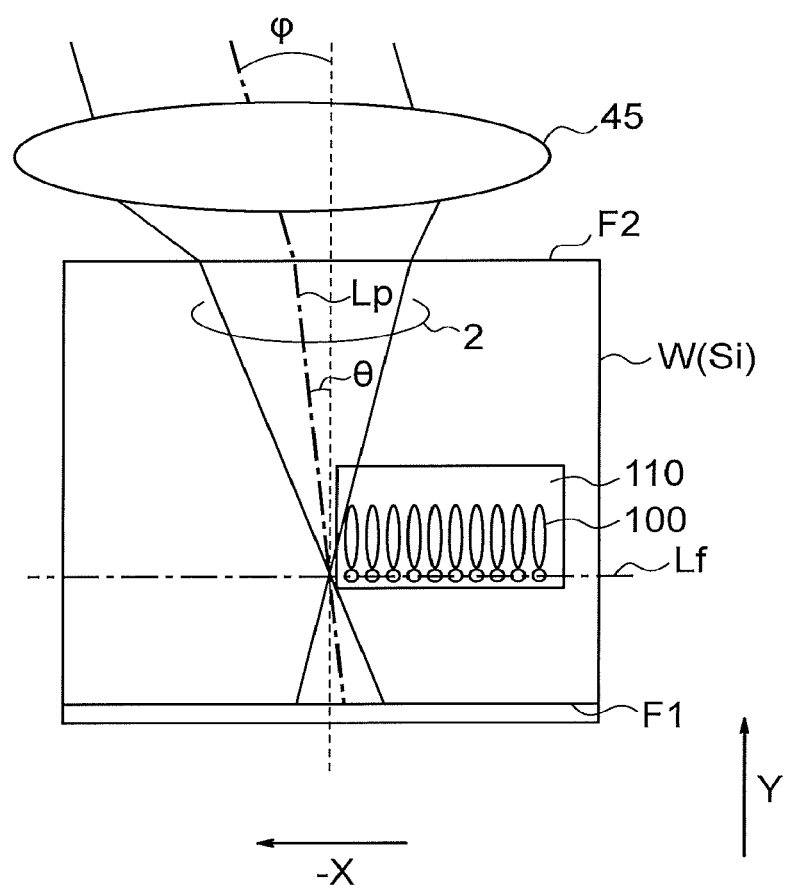
FIG. 13 is a sectional view illustrating a configuration example of the laser processing apparatus according to the third embodiment.

FIG. 13 is a sectional view illustrating a configuration example of the laser processing apparatus 1 according to the third embodiment. In the third embodiment, the light modulator controller 46 inclines the incident angle of the laser light 2 with respect to the optical axis of the objective lens 45 in the relative movement direction (the −X direction) of the objective lens 45 with respect to the semiconductor substrate W from a perpendicular direction (a Y direction) to the front surface F1 or the rear surface F2 of the semiconductor substrate W. The peak position P is not displaced from the center of the energy density distribution of the laser light 2. The objective lens 45 itself is not inclined and the optical axis of the objective lens 45 is almost aligned with the Y direction. Other configurations of the third embodiment can be identical to corresponding configurations of the first embodiment.

For example, it is assumed that the angle at which the laser light 2 is incident on the objective lens 45 is φ and the angle at which the laser light 2 is incident on the focus position Lf is θ. The incident angles φ and θ are incident angles of the laser light 2 at the peak position P as indicated by a line Lp.

In this case, the incident angles φ and θ are angles at which the laser light 2 is inclined in the relative movement direction (the −X direction) of the objective lens 45 from the optical axis (the Y direction) of the objective lens 45. The laser light 2 is incident on the objective lens 45 with an inclination at the incident angle φ in the relative movement direction (the −X direction) of the objective lens 45 from the optical axis (the Y direction) of the objective lens 45. The laser light 2 is incident on the focus position Lf with an inclination at the incident angle θ in the relative movement direction (the −X direction) of the objective lens 45 from the Y direction.

In other words, the light modulator controller 46 controls the light modulator 43 to incline the incident angle of the laser light 2 on the objective lens 45 at the angle φ in the formation direction of the modified regions 100 from the Y direction. Accordingly, the laser light 2 is incident on the focus position Lf with an inclination at the incident angle θ in the relative movement direction (the −X direction) of the objective lens 45 from the Y direction. That is, the line Lp is inclined at the angle θ with respect to the processing progression direction.

This inclination of the incident angle of the laser light 2 in the processing progression direction from the Y direction enables the laser light 2 at the peak position P where the energy density is high to reach the focus position Lf almost without passing through the modified regions 100 and the cleaved region 110. Therefore, the third embodiment can achieve effects identical to those of the first embodiment.

When the movement direction of the objective lens 45 with respect to the semiconductor substrate W is changed, the light modulator controller 46 changes the light modulator 43 to incline the incident angles φ and θ in the movement direction. That is, the light modulator controller 46 automatically switch the incident angles φ and θ to be adapted to the movement direction of the objective lens 45. Accordingly, even when the movement direction of the objective lens 45 with respect to the semiconductor substrate W is changed, the scattered light of the laser light 2 can be continuously suppressed. As a result, the processing time of the semiconductor substrate W can be relatively shortened.

Fourth Embodiment

Figure 14:
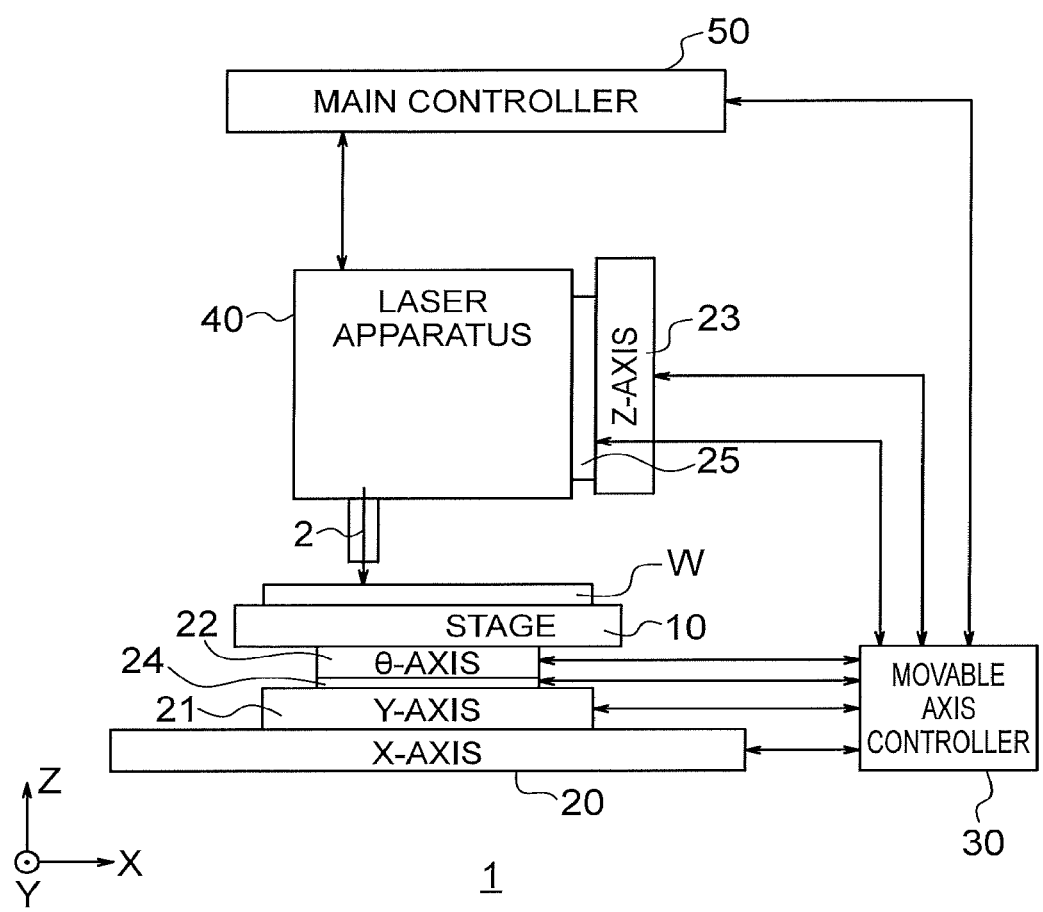
FIG. 14 is a schematic diagram illustrating a configuration example of a laser processing apparatus according to a fourth embodiment.

FIG. 14 is a schematic diagram illustrating a configuration example of the laser processing apparatus 1 according to a fourth embodiment. In the third embodiment, the incident angle of the laser light 2 is inclined from the optical axis of the objective lens 45 without the optical axis of the objective lens 45 being inclined. In contrast thereto, the optical axis of the objective lens 45 is inclined along with the incident angle of the laser light 2 in the fourth embodiment. In this case, the incident angle of the laser light 2 does not need to be inclined from the optical axis of the objective lens 45.

In order to realize this mode, the laser processing apparatus 1 according to the fourth embodiment further includes inclined axis drivers 24 and 25. The inclined axis driver 24 is provided below the stage 10 and is configured to incline the stage 10 along with the semiconductor substrate W. The inclined axis driver 25 is provided on the laser apparatus 40 and is configured to incline the laser apparatus 40 along with the objective lens 45. The inclined axis drivers 24 and 25 are controlled by the movable axis controller 30. The movable axis controller 30 changes the angle of the semiconductor substrate W or the angle of the objective lens 45 according to the modulation pattern. This can incline the optical axis of the objective lens 45 along with the incident angle of the laser light 2 to change the incident angle of the laser light 2. Other configurations of the fourth embodiment can be identical to corresponding configurations of the first embodiment.

Figure 15:
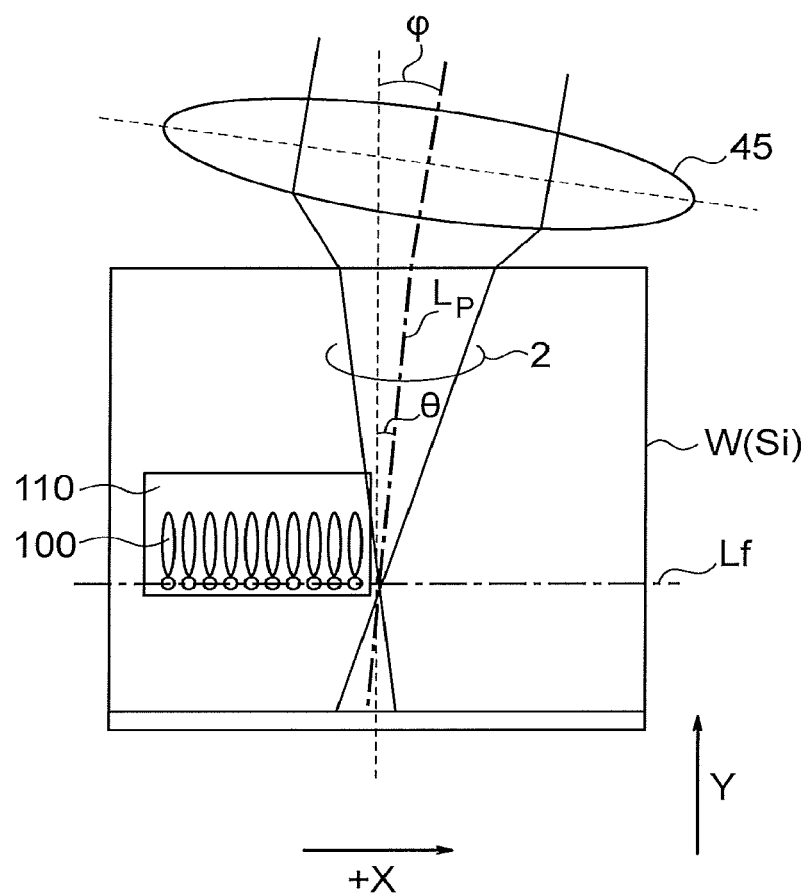
FIG. 15 is a sectional view illustrating a configuration example of the laser processing apparatus according to the fourth embodiment.

FIG. 15 is a sectional view illustrating a configuration example of the laser processing apparatus 1 according to the fourth embodiment. In the fourth embodiment, the optical axis of the objective lens 45 and the incident angle of the laser light 2 are inclined in the relative movement direction (the +X direction) of the objective lens 45 with respect to the semiconductor substrate W from the perpendicular direction (the Y direction) to the front surface F1 or the rear surface F2 of the semiconductor substrate W. In FIG. 15, the movement direction of the objective lens 45 is assumed to be the +X direction.

For example, the incident angle of the laser light 2 and the optical axis of the objective lens 45 are inclined by an angle φ from the Y direction. It is then assumed that an angle at which the laser light 2 is incident on the focus position Lf is θ. Directions of the inclination of the incident angle of the laser light 2 and the optical axis of the objective lens 45 are the relative movement direction (the +X direction) of the objective lens 45 from the Y direction. That is, the incident angles φ and θ are angles of the inclination in the relative movement direction (the +X direction) of the objective lens 45 from the Y direction.

The laser light 2 is incident on the objective lens 45 with an inclination at the incident angle φ in the relative movement direction (the +X direction) of the objective lens 45 from the Y direction. Accordingly, the laser light 2 is incident on the focus position Lf with an inclination at the incident angle θ in the relative movement direction (the +X direction) of the objective lens 45 from the Y direction.

In other words, the movable axis controller 30 controls the inclined axis driver 25 to incline the optical axis of the objective lens 45 and the incident angle of the laser light 2 at the angle φ in the formation direction of the modified regions 100 from the Y direction. Due to control of the inclined axis driver 25 by the movable axis controller 30, the objective lens 45 and the laser apparatus 40 can be inclined with respect to the stage 10. Accordingly, the laser light 2 is incident on the focus position Lf with an inclination at the incident angle θ in the relative movement direction (the +X direction) of the objective lens 45 from the Y direction. That is, the line Lp is inclined at the angle θ with respect to the processing progression direction.

When the movement direction of the objective lens 45 with respect to the semiconductor substrate W is changed, the movable axis controller 30 changes the inclination directions of the light modulator 43 and the objective lens 45 to incline the incident angles φ and θ in the movement direction. That is, the movable axis controller 40 automatically switches the incident angles φ and θ to be adapted to the movement direction of the objective lens 45. Switching of the inclination angle of the optical axis of the objective lens 45 can alternatively be performed by the movable axis controller 30 that controls the inclined axis driver 24 to change the inclination of the stage 10 with respect to the objective lens 45 or the laser apparatus 40.

Accordingly, the scattered light of the laser light 2 can be continuously suppressed even when the movement direction of the objective lens 45 with respect to the semiconductor substrate W is changed. Therefore, the fourth embodiment can achieve effects identical to those of the third embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus irradiating a semiconductor substrate with pulse laser to form modified regions along an intended cut line in the semiconductor substrate and to cut the semiconductor substrate, the apparatus comprising:
   a stage mounting the semiconductor substrate thereon;
   a light source configured to emit the pulse laser;
   an optical system comprising an objective lens configured to focus the pulse laser in the semiconductor substrate:
   a light modulator configured to he capable of modulating an energy density distribution of the pulse laser and to be controlled by a light modulator controller;
   a movable axis controller configured to move the optical system with respect to the stage; and
   a main controller configured to control the light modulator controller and the movable axis controller to displace a peak position of the energy density distribution of the pulse laser in a processing progression direction from an optical axis of the objective lens such that the peak position is displaced to reach a focus position by passing outside of the modified regions, wherein
   only a focus position of the pulse laser forming the modified regions is provided in the semiconductor substrate.

2. The apparatus of claim 1, wherein the main controller controls the light modulator controller to displace the peak position with respect to the optical axis of the objective lens in the movement direction when the movement direction is changed.

3. The apparatus of claim 2, wherein the main controller controls the light modulator controller to displace the peak position of the energy density distribution of the pulse laser in the movement direction from a center of the energy density distribution.

4. The apparatus of claim 2, wherein the main controller controls the light modulator controller to displace a center of the energy density distribution of the pulse laser in the movement direction from the optical axis of the objective lens.

5. The apparatus of claim 1, wherein the main controller controls the light modulator controller to displace the peak position of the energy density distribution of the pulse laser in the movement direction from a center of the energy density distribution.

6. The apparatus of claim 1, wherein the main controller controls the light modulator controller to displace a center of the energy density distribution of the pulse laser in the movement direction from the optical axis of the objective lens.

7. A semiconductor manufacturing apparatus irradiating a semiconductor substrate with pulse laser to form modified regions along an intended cut line in the semiconductor substrate and to cut the semiconductor substrate, the apparatus comprising:
   a stage mounding the semiconductor substrate thereon;
   a light source configured to emit the pulse laser;
   an objective lens configured to be driven and controlled by a light modulator controller and to focus the pulse laser in the semiconductor substrate;
   an optical system in which the incident angle of the laser light to the objective lens is controlled by the light modulator controller;
   a light modulator configured to be capable of modulating the energy density distribution of the pulse laser and controlled by the light modulator controller;
   a movable axis controller configured to move the optical system with respect to the stage; and
   a main controller configured to control the light modulator controller and the movable axis controller so as to incline an incident angle of the pulse laser in a processing progression direction from a perpendicular direction to a front surface of the semiconductor substrate such that the peak position is displaced to reach a focus position by passing outside of the modified regions, wherein only a single focus position of the pulse laser forming the modified regions is provided in the semiconductor substrate.

8. The apparatus of claim 7, wherein the main controller controls the light modulator controller to incline the incident angle in the movement direction when the movement direction is changed.

9. The apparatus of claim 8, wherein the main controller controls the light modulator controller to incline an incident angle of the pulse laser with respect to the objective lens from the perpendicular direction.

10. The apparatus of claim 7, wherein the main controller controls the light modulator controller to incline an incident angle of the pulse laser with respect to the objective lens from the perpendicular direction.

11. The apparatus of claim 7, wherein the main controller controls the objective lens to incline an optical axis of the objective lens from the perpendicular direction.

* * * * *